(12) United States Patent
Khou et al.

(10) Patent No.: US 6,408,423 B1
(45) Date of Patent: Jun. 18, 2002

(54) METHOD FOR FASTER VERIFICATION OF A DESIGN FOR AN INTEGRATED CIRCUIT

(75) Inventors: Beng Chew Khou; Joon Kit Goh, both of Singapore (SG); Jacques Wong, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/533,375

(22) Filed: Mar. 22, 2000

Related U.S. Application Data

(60) Provisional application No. 60/173,480, filed on Dec. 29, 1999.

(51) Int. Cl.[7] .............................................. G06F 17/50
(52) U.S. Cl. ..................................... 716/4; 716/5; 716/6
(58) Field of Search ........................... 716/1–21; 714/4; 710/23, 31, 63, 100, 107; 709/212, 228, 246; 370/296; 326/93

(56) References Cited

U.S. PATENT DOCUMENTS 5,452,420 A * 9/1995 Engdahl et al. ................ 710/5
6,260,175 B1 * 6/2001 Basel ............................. 716/1

* cited by examiner

Primary Examiner—Matthew Smith
Assistant Examiner—Naum Levin

(57) ABSTRACT

A method for testing and verifying an integrated circuit using a bottom-up approach to generate a complete integrated circuit. The design for an integrated circuit is divided or defined into individual sub-system modules which are then tested either individually or as a combination of sub-system modules (e.g., a partially integrated circuit). Once all of the sub-system modules are tested and verified, the sub-system modules can be combined to form a complete integrated circuit which can then be tested. Each of the sub-system modules, the partially integrated circuit and the complete integrated circuit are tested and verified.

13 Claims, 8 Drawing Sheets

METHOD FOR FASTER VERIFICATION OF A DESIGN FOR AN INTEGRATED CIRCUIT

RELATED APPLICATIONS

This application claims priority from U.S. Provisional Application No. 60/173,480, filed Dec. 29, 1999, which is incorporated herein by reference.

FIELD OF THE INVENTION

The present invention relates to a method for testing sub-system modules of a design for an integrated circuit, and more specifically for testing sub-system modules of a design for a network interface.

DESCRIPTION OF RELATED ART

During the design and development of an integrated circuit, such as a network interface, the individual components of the integrated circuit can be tested and the integrated circuit itself can be tested after completion of the entire circuit. However, the components which make up sub-system modules of the integrated circuit cannot be tested until the entire integrated circuit has been constructed. Failure to test the individual sub-systems prior to completion of the entire integrated circuit causes undue delay and further complicates the final testing. For example, if the design and construction of one sub-system of the network interface is delayed, then the testing of the entire network interface is delayed.

In addition, identifying component specific problems can be difficult because problems can be compounded by various sub-system modules. The compounded problems can lead to misdiagnoses, as well as causing further delays.

DESCRIPTION OF THE INVENTION

There is a need for a method to test and verify sub-system modules which when combined to form a complete integrated circuit. There is also a need to be able to incorporate smaller sub-systems into larger sub-systems in order to test the larger sub-systems prior to completion of the integrated circuit. There is also a need to be able to test and verify an integrated circuit in a more efficient manner.

These and other needs are attained by the present invention, where a design for an integrated circuit is defined into sub-system modules and the sub-system modules are tested and verified using system parameters for the integrated circuit. The sub-system modules can be tested individually, in combination with other sub-system modules and as a completed integrated circuit. Each of the sub-system modules can be tested using system tasks. For example, sub-system module containing memory can have data written into the memory and read from the memory to verify that the memory is functioning properly. After a sub-system module passes a verification test, a single or plurality of sub-system modules can be combined with the sub-system module to form a larger sub-system module.

Testing and verifying the sub-system modules in a progressive manner provides an efficient verification of the integrated circuit design. In addition, since problems can be identified easier, a design can be modified or re-designed to overcome a problem with a current design, if necessary.

Additional advantages and novel features of the invention will be set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein.

DETAILED DESCRIPTION OF THE INVENTION

The present invention is described in the context of an IEEE 802.3 compliant network interface configured for sending and receiving data packets between a system memory and a network medium using established Media Access Control (MAC) 26 (FIG. 1) and Physical Layer (PHY) protocols. An overview will first be provided of the network interface, followed by a description of the arrangement for testing and verifying sub-system modules of the network interface independently and in a progressive manner.

NETWORK INTERFACE OVERVIEW

Figure 1:
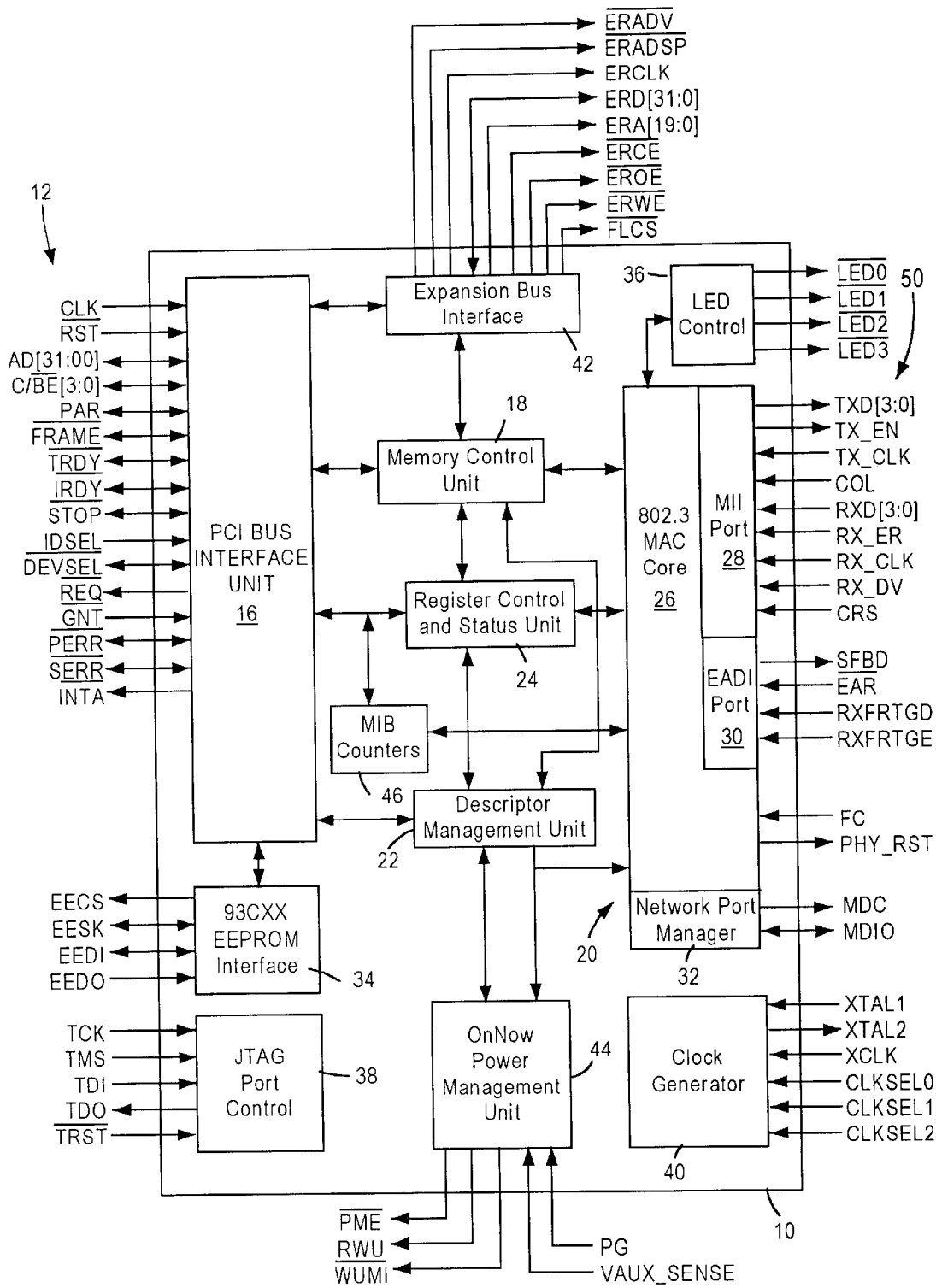
FIG. 1 is a block diagram of an exemplary network interface that accesses the media of an Ethernet network according to an embodiment of the present invention.

FIG. 1 is a block diagram of an exemplary network interface 10 that accesses the media of an Ethernet network according to an embodiment of the present invention.

The network interface 10, preferably a single-chip, 32-bit Ethernet controller, provides an interface between a local bus 12 of a computer, for example, a peripheral component interconnect (PCI) local bus, and an Ethernet-based media 50. The reference numeral 50 identifies either an actual network medium, or alternately a signal path (e.g., a media independent interface (MII)) to a physical layer transceiver coupled to the network media.

The network interface 10 includes a PCI bus interface unit 16, a memory control unit 18, a network interface portion 20, a descriptor management unit 22 and a register control and status unit 24. The network interface portion 20 includes an IEEE 802.3 compliant and full-duplex capable media access control (MAC 26) core 26, a Media Independent Interface (MII) port 28 for connecting external 10 Mb/s, 100 Mb/s or 1000 Mb/s transceivers, an External Address Detection Interface (EADI) port 30, and a network port manager unit 32. The network interface 10 also includes an EEPROM interface 34 for reading from and writing to an external EEPROM 60, an LED control 36, an IEEE 1149.1-compliant JTAG Boundary Scan test access port interface 38, a clock generation unit 40, and an expansion bus interface 42. The expansion bus interface unit 42 interfaces to an external or internal data memory (not shown in FIG. 1) for frame storage and also to non-volatile (e.g., EPROM or Flash memory) storage for boot ROM use during startup.

The PCI bus interface unit 16, compliant with the PCI local bus specification (revision 2.2), receives data frames from a host computer memory via the PCI bus 12. The PCI bus interface unit 16, under the control of the descriptor management unit 22, receives transfers from the host computer via the PCI bus 12. For example, transmit data received from the PCI bus interface unit 16 is passed to the memory control unit 18 which stores it in the data memory. Subsequently, the memory control unit 18 retrieves the transmit data from the data memory and passes it to the MAC 26 for eventual transmission to the network. Similarly, receive data from the network 50 is processed by the MAC 26 and passed to the memory control unit 18 for storage in the data memory. Subsequently, the memory control unit 18 retrieves the receive data from the data memory and passes it to the PCI bus interface unit 16 for transfer to the host computer via the PCI bus 12.

The descriptor management unit 22 manages the transfers of data to and from the host computer via the PCI bus interface unit 16. Data structures contained in the memory of the host computer specify the size and location of data buffers along with various control and status information. The descriptor management unit 22 interfaces with the memory control unit 18 to insert control information into the transmit data stream and to retrieve status information from the receive data stream.

The network interface portion 20 includes a network port manager 32 that performs auto-negotiation functions by communicating via the media 50 with a corresponding auto-negotiation unit in the link partner (e.g., a centralized hub, repeater, workstation, or switch).

The network interface 10 also includes a power management unit 44 that enables remote activation (i.e., turn-on) of the host computer via the network medium 50 by detecting a predetermined pattern on the network medium 50 according to Microsoft OnNow and ACPI specifications, including compliance with Magic Packet technology and PCI Bus Power Management Interface Specification protocols.

The network interface 10 also includes a MIB counter unit 46 which accepts information from the MAC 26 regarding frame transmission and reception and maintains the statistics necessary for network management. These statistics are accessed by the host computer via the PCI bus interface unit 16.

Figure 2:
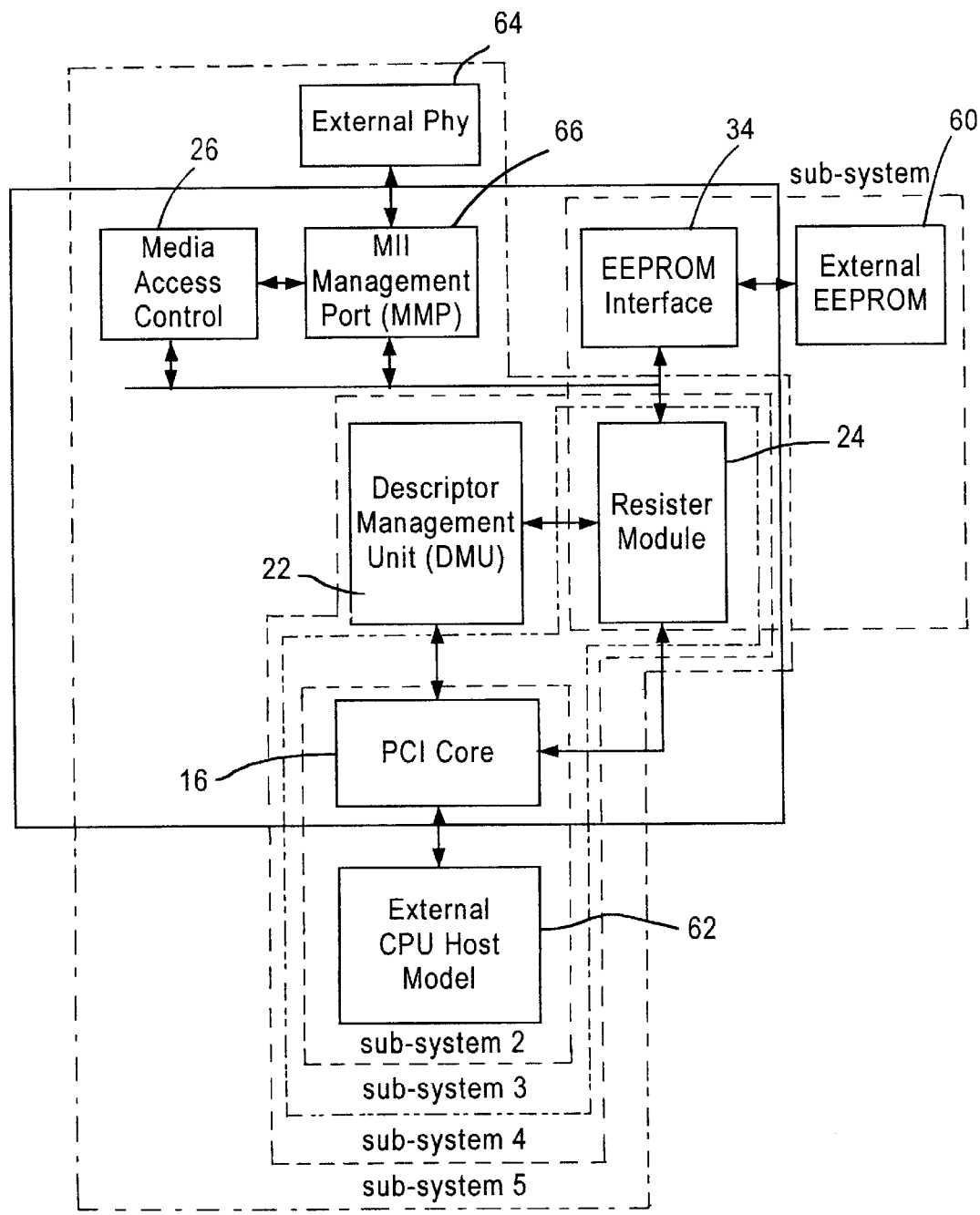
FIG. 2 is an overall block diagram illustrating the sub-system modules of the exemplary network interface.

FIG. 2 is an overall diagram illustrating the sub-system modules of the exemplary network interface. As illustrated, integrated circuit is divided or defined into five sub-system modules. The first sub-system module comprises an external EEPROM 60, the EEPROM interface 34, the register module (or the register control and status unit as illustrated in FIG. 1) 24 and an external central processing unit (CPU) host computer 62. The second sub-system module comprises the external CPU host computer 62 and the PCI (or the PCI Bus Interface Unit as illustrated in FIG. 1) 16. The third sub-system comprises the external CPU host model 62, the PCI 16, and the register module 24. The fourth sub-system comprises the external CPU host model 62, the PCI 16, the register module 24, and the descriptor management unit (DMU) 22. The fifth sub-system comprises the external CPU host model 62, the PCI 16, the register module 24, the DMU 22, a media access control (MAC or the 802.3 MAC Core as illustrated in FIG. 1) 26, the Media Independent Interface (MII) management port (MMP or MII port 28 and network port manager 32 as illustrated in FIG. 1) 66, and an external physical layer device (PHY) 64.

Figure 3:
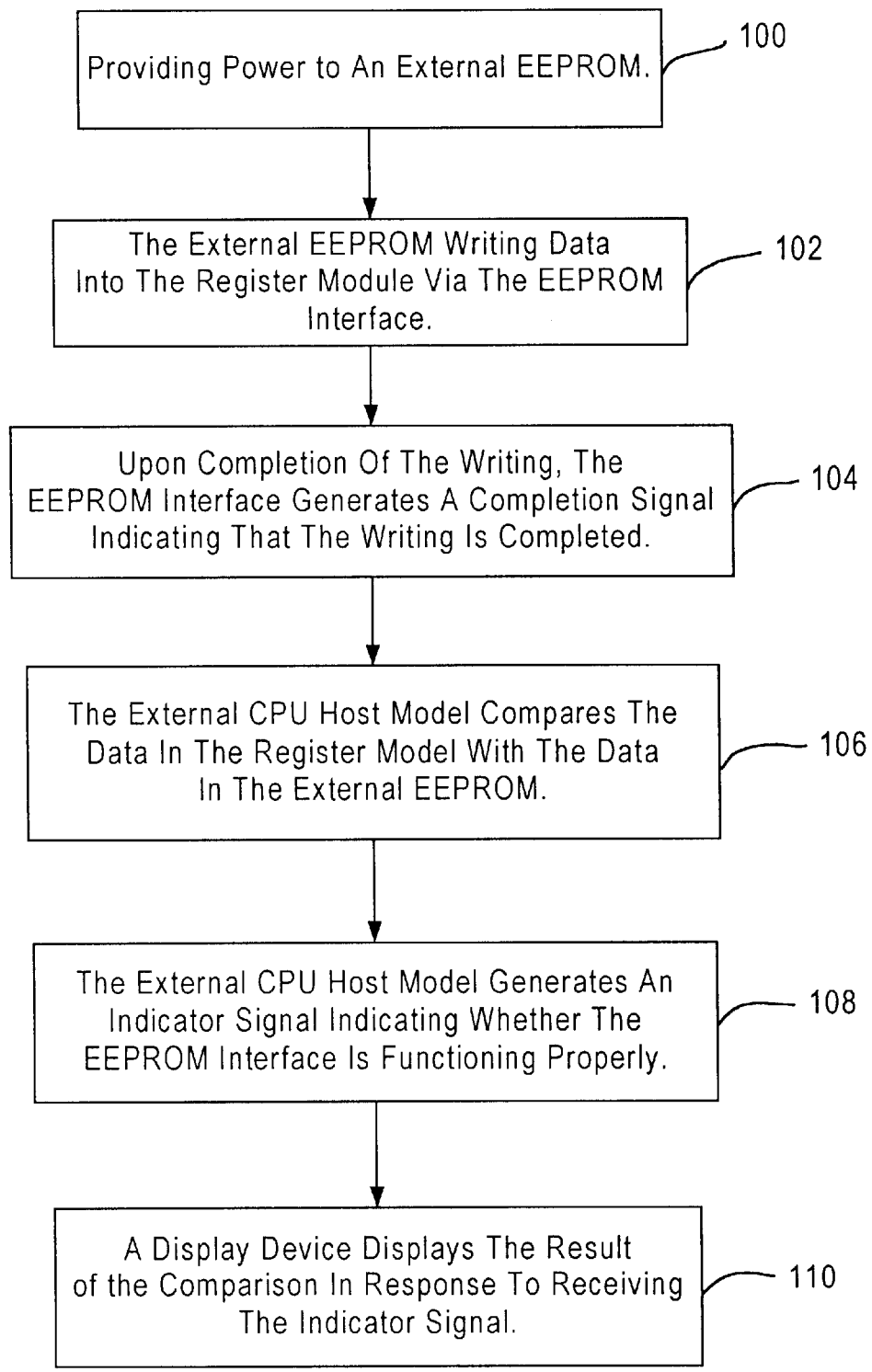
FIG. 3 is a flow chart of a method for testing the first sub-system module of the exemplary network interface.

FIG. 3 is a flow chart of a method for testing the first sub-system module of the network interface. The testing starts with the External EEPROM 60 receiving a hard reset, e.g., providing power to the External EEPROM 60 at step 100. The external EEPROM 60 writes data into the register module 24 via the EEPROM interface 34 at step 102. Upon completion of the writing, the EEPROM interface 34 generates a completion signal indicating that the EEPROM interface 34 has finished writing the data into the register module 24 at step 104. The external CPU host model 62 compares the data in the register module 24 with the data in the external EEPROM 60 to ensure that the EEPROM interface 34 is functioning properly at step 106. The external CPU host model 62 then generates an indicator signal indicating whether the EEPROM interface 34 is functioning properly at step 108. A display device displays the result of the comparison in response to receiving the indicator signal at step 110.

Figure 4:
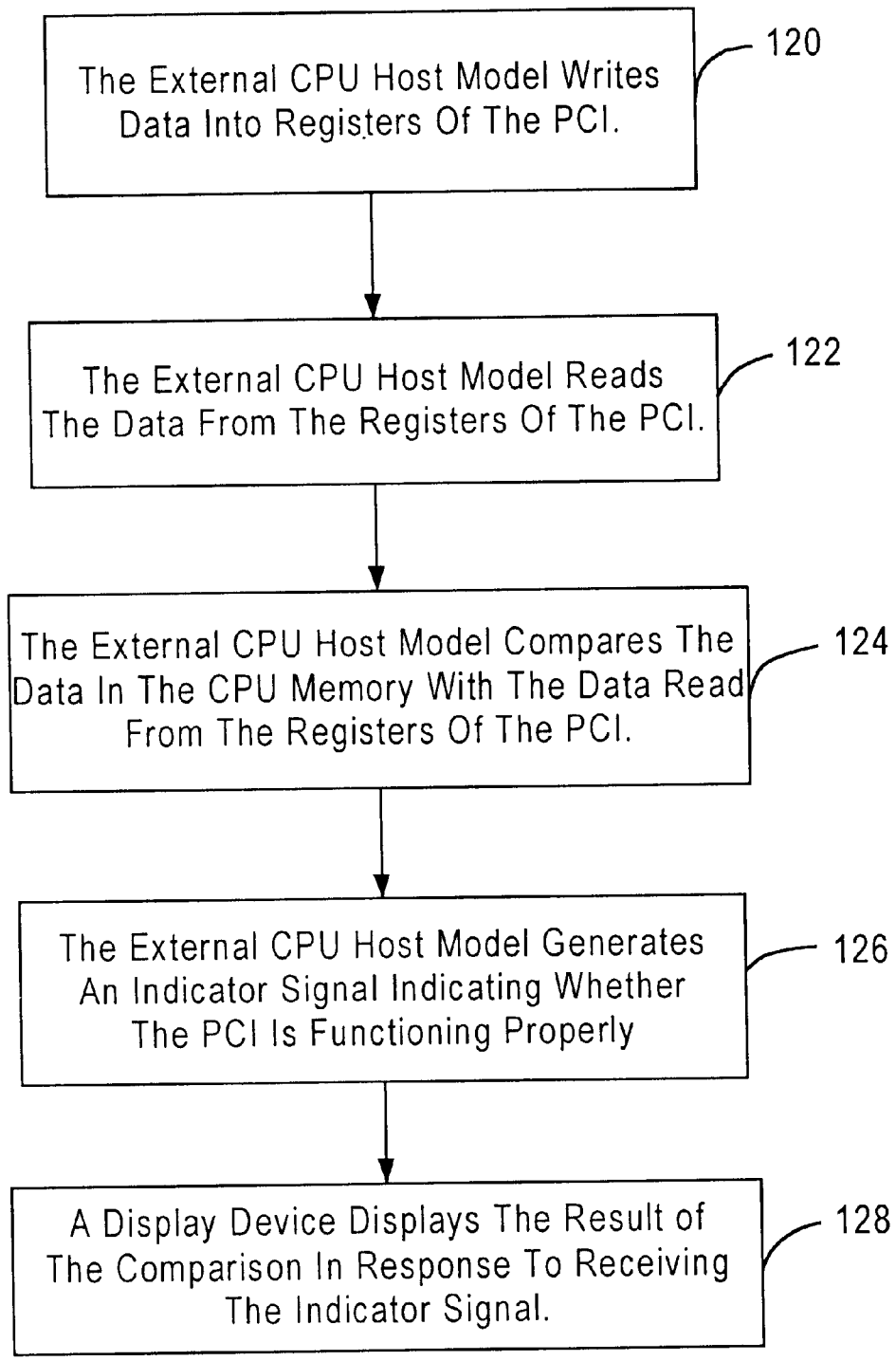
FIG. 4 is a flow chart of a method for testing the second sub-system module of the exemplary network interface.

FIG. 4 is a flow chart of a method for testing the second sub-system module of the network interface. This method begins with the external CPU host model 62 writing data from CPU memory into registers of the PCI 16 at step 120. The external CPU host model 62 then reads the data from the PCI 16 at step 122. The external CPU host model 62 compares the data in the CPU memory with the data read from the registers of the PCI 16 to determine if the PCI 16 is functioning properly at step 124. The external CPU host model 62 then generates an indicator signal indicating whether the PCI 16 is functioning properly at step 126. A display device connected to the external CPU host model 62 displays the result of the comparison in response to receiving the indicator signal at step 128.

Figure 5:
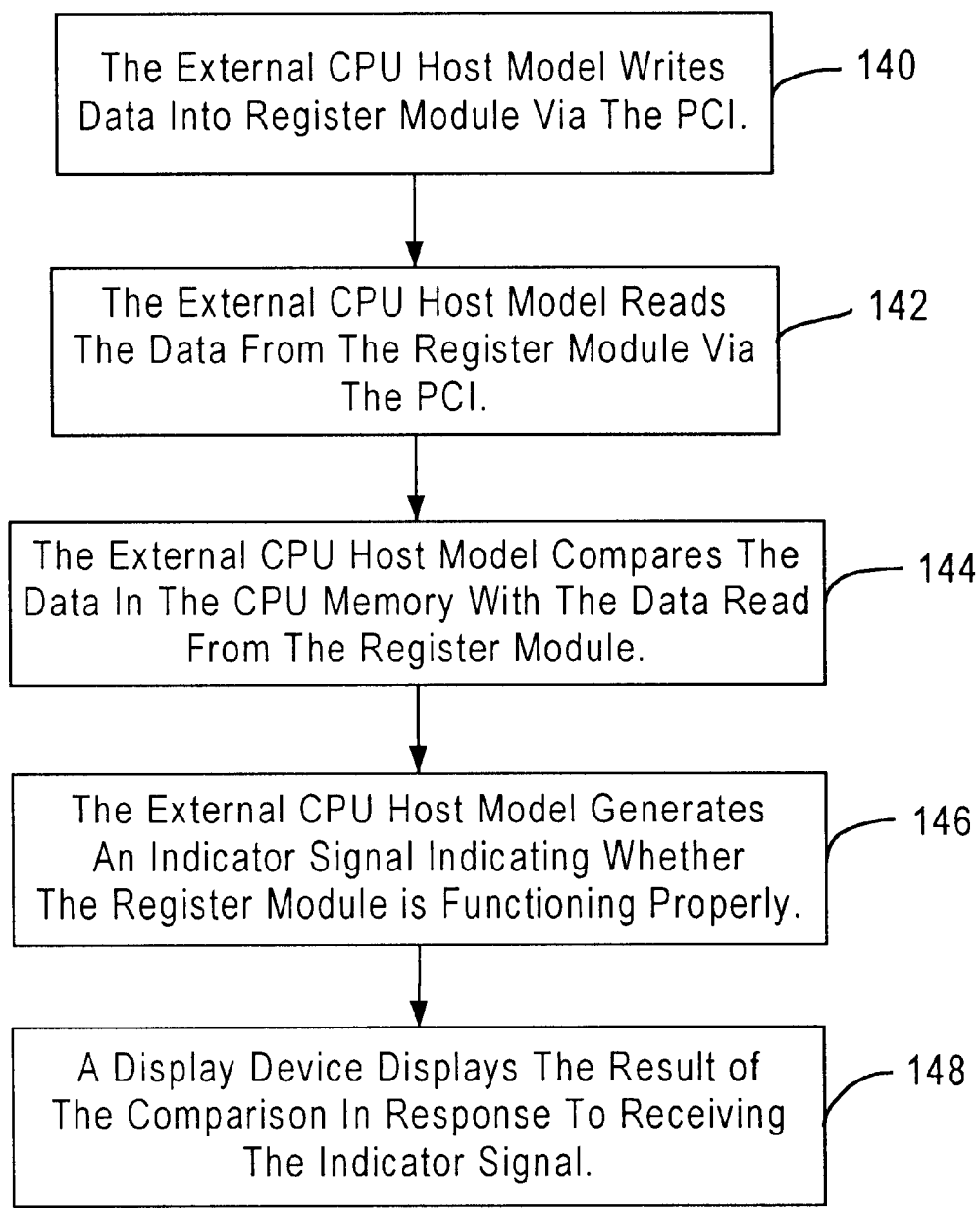
FIG. 5 is a flow chart of a method for testing the third sub-system module of the exemplary network interface.

FIG. 5 is a flow chart of a method for testing the third sub-system module of the network interface. The third sub-system module begins with the external CPU host model 62 writing data to the CPU memory into the register module 24 through the PCI 16 at step 140. The external CPU host model 62 then reads the data from the register module 24 through the PCI 16 at step 142. The external CPU host model 62 compares the data in the CPU memory with the data read from the register module 24 to determine if the register module 24 is functioning properly at step 144. The external CPU host model 62 generates an indicator signal indicating whether the interface between PCI 16 and the register module 24 is functioning properly at step 146. A display device connected to the external CPU host model 62 displays the result of the test in response to receiving the indicator signal at step 148.

Figure 6:
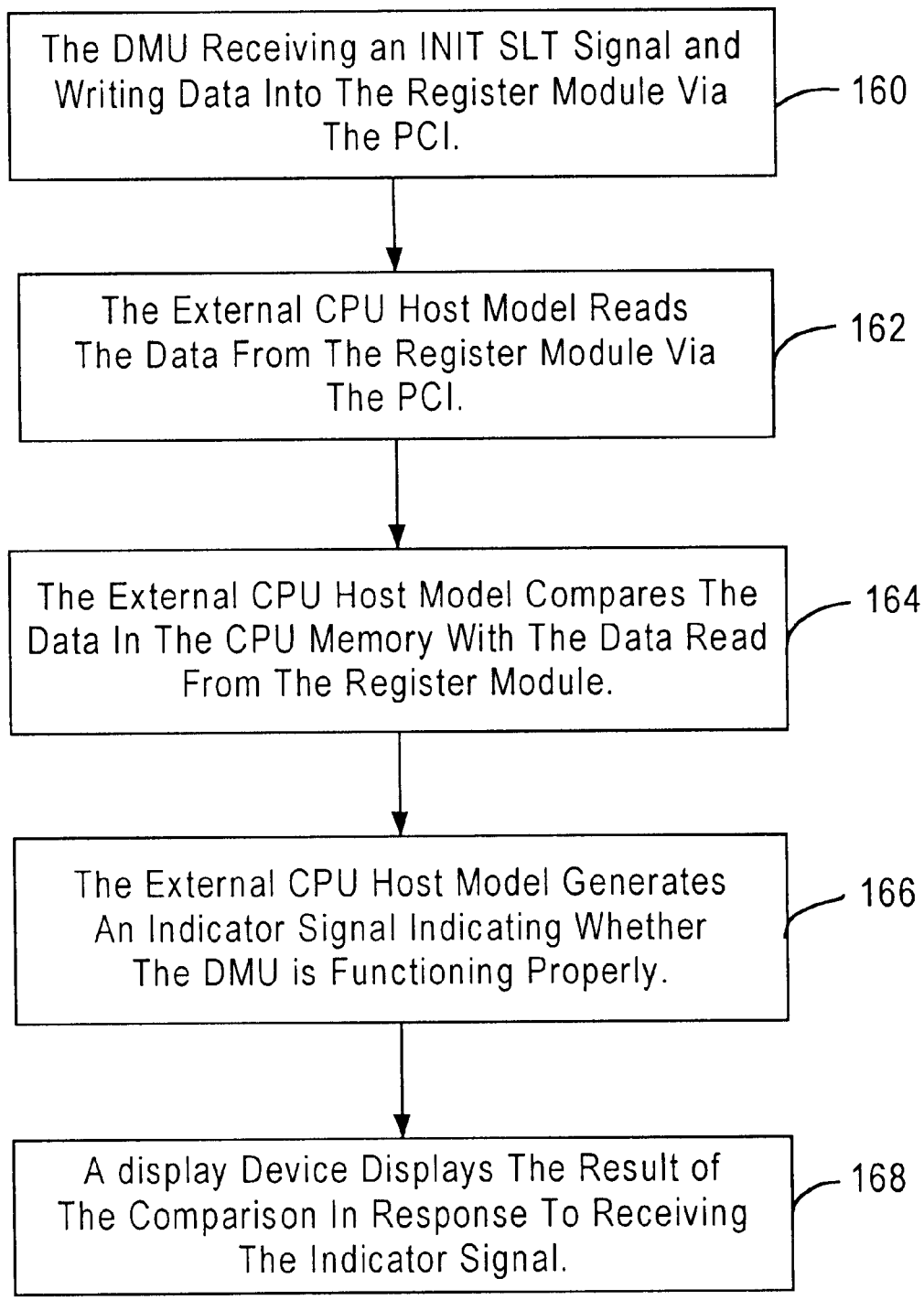
FIG. 6 is a flow chart of a method for testing the fourth sub-system module of the exemplary network interface.

FIG. 6 is a flow chart of a method for testing the fourth sub-system module of the network interface. The fourth sub-system module begins with the DMU 22 receiving an INIT set signal and the DMU 22 reading data from the CPU memory of the external CPU host model 62 and writing the data into the register module 24 via the PCI 16 at step 160. The external CPU host model 62 then reads the data from the register module 24 at step 162. The external CPU host model 62 compares the data in the CPU memory with the data read from the register module 24 to determine if the DMU 22 is functioning properly at step 164. The external CPU host model 62 generates an indicator signal indicating whether the DMU 22 is functioning properly at step 166. A display device connected to the external CPU host model 62 displays the result of the test in response to receiving the indicator signal at step 168.

Figure 7:
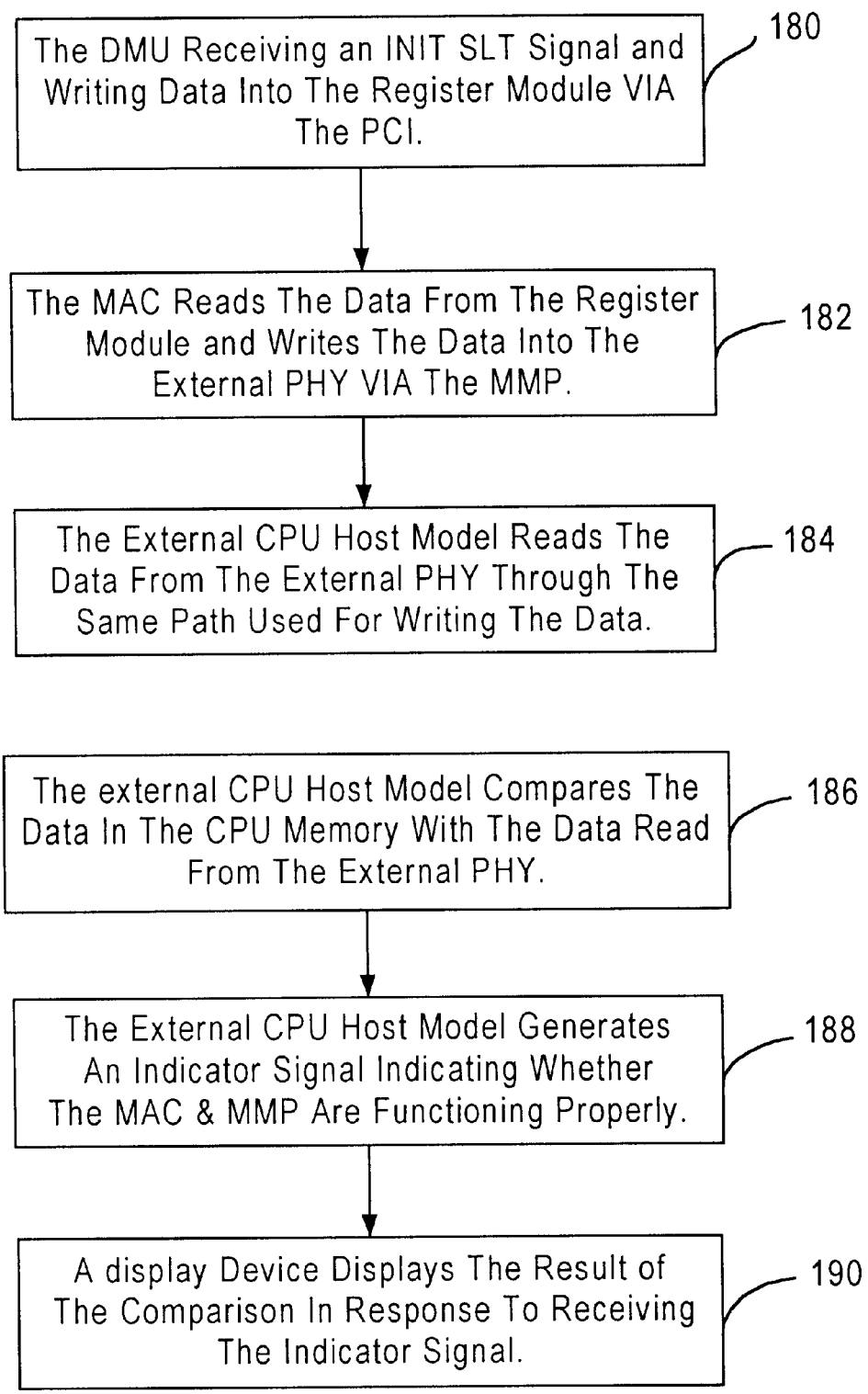
FIG. 7 is a flow chart of a method for testing the fifth sub-system module of the exemplary network interface.

FIG. 7 is a flow chart of a method for testing the fifth sub-system module of the network interface. The fifth sub-system module begins with the DMU 22 receiving an INIT set signal and the DMU 22 reading data from the CPU memory of the external host CPU model and writing the data into the register module 24 via the PCI 16 at step 180. The MAC 26 reads the data from the register module 24 and writes the data into the external PHY 64 via the MMP 66 at step 182. The external CPU host model 62 then reads the data from the external PHY 64 back though the same path used for writing the data into the external PHY 64 at step 184. The external CPU host model 62 compares the data in the CPU memory with the data read from the external PHY 64 to determine if the MAC 26 and MMP 66 are functioning properly at step 186. The external CPU host model 62 generates an indicator signal indicating whether the MAC 26 and MMP 66 are functioning properly at step 188. A display device connected to the external CPU host model 62 displays the result of the test in response to receiving the indicator signal at step 190.

Although the method has been described for an exemplary embodiment, the network interface, the method is not limited to this embodiment. The method can be applied to the design of any integrated circuit. The following description describes the method as it pertains to the design of an integrated circuit.

Figure 8:
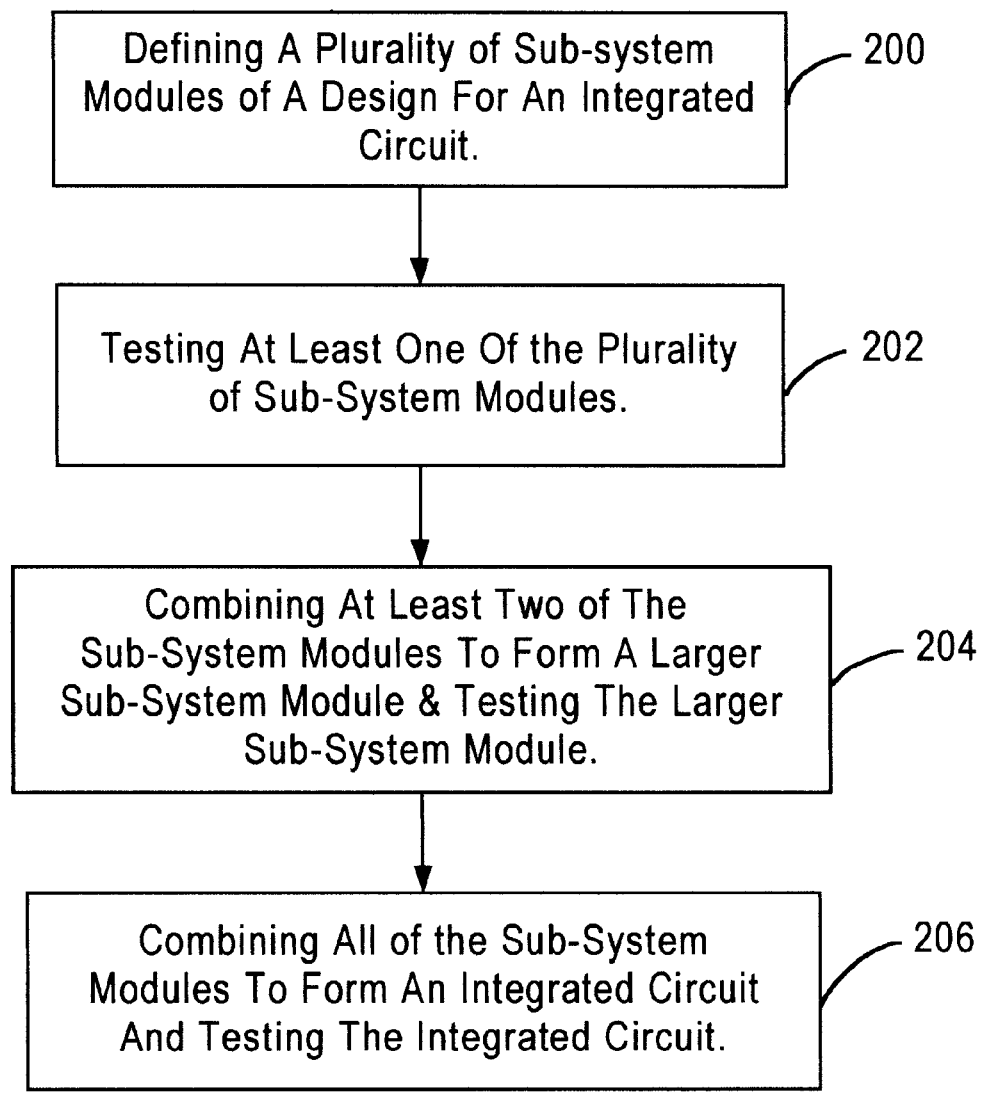
FIG. 8 is a flow chart of a method for testing the design of an integrated circuit.

FIG. 8 is a flow chart of a method for testing the design of an integrated circuit. The method starts with defining the sub-systems of the design for an integrated circuit at step 200. For example, the sub-system modules of the exemplary network device of FIG. 1 are divided or defined into five sub-system modules as illustrated in FIG. 2. At least one of the sub-system modules is tested using system parameters for the integrated circuit at step 202. Specifically, the sub-system modules are tested using hardware description language (HDL). FIGS. 3–7 further illustrate the steps used for testing the sub-system modules.

At least two of the sub-system modules are combined to form a larger sub-system module and are tested using system parameters for the integrated circuit at step 204. In certain embodiments, each of the sub-system modules which are combined in step 204 are tested using system parameters for the integrated circuit prior to combining the at least two sub-system modules. Testing the individual sub-system modules prior to combining them, reduces the probabilities that the problem is caused by the sub-system modules but rather the connections for connecting the sub-system modules.

The plurality of sub-system modules are combined to form the integrated circuit and the integrated circuit is then tested using system parameters for the integrated circuit at step 206. Again, by testing the individual sub-system modules prior to combining them, the probabilities that a problem is caused by the sub-system modules is reduced and typically indicates that the problem is caused by the connections for the sub-system modules.

Moreover, the present invention allows for progressive testing, where a component is added to a previously tested and verified sub-system module. For example, after testing the second sub-system module in FIG. 2, the register module 24 is added to form the third sub-system module. If a problem occurs, the problem is assumed to be either the register module 23 or with the connections associated with the register module 23.

The capability of testing sub-system module of a network interface, independently and in a progressive manner allows for more efficient testing of a network interface. In addition, the testing is less complicated and problems can be detected at earlier stages of the design and manufacture processes. Testing the sub-system modules in a progressive manner also reduces the chances of compounded errors because the problems are most likely detected and corrected prior to the testing of a later sub-system. In addition, by using the HDL for testing the sub-system modules, the sub-system modules are tested under ideal circumstances, namely providing realistic testing of the individual sub-system modules, as well as the fully integrated circuit.

While this invention has been described in connection with what is presently considered to be the most practical and preferred embodiments, it is to be understood that the invention is not limited to the disclosed embodiments, but, on the contrary, is intended to cover various modifications and equivalent arrangements included within the scope of the appended claims.

What is claimed is:

1. A method for testing a design for a network interface, comprising:

defining a plurality of sub-system modules for the design of the network interface, each of the plurality of sub-system modules comprises at least one component of the network interface;

testing each of the plurality of sub-system modules individually using system parameters for the network interface;

combining the plurality of sub-system modules to form the network interface; and testing the formed network interface using system parameters for the network interface.

2. The method of claim 1, wherein the testing of one of the plurality of sub-system modules comprises:

providing power to an external EEPROM;

writing data into a register module from the external EEPROM via an EEPROM interface;

generating a completion signal by the external EEPROM indicating that the writing of the data is complete;

comparing the data in the register module with the data in the external EEPROM by an external central processing unit host model; and generating an indicator signal indicating whether the EEPROM interface is functioning properly based on the comparison.

3. The method of claim 2, further comprising displaying the result of the comparison in response to receiving the indicator signal.

4. The method of claim 1, wherein the testing of one of the plurality of sub-system modules comprises:

writing data into registers of a peripheral control interface (PCI) by an external central processing unit (CPU) host model from a memory in the external CPU host model;

reading the data in the registers of the PCI by the external CPU host model;

comparing the data in the registers of the PCI with the data in the memory of the external CPU host model; and generating an indicator signal indicating whether the PCI is functioning properly based on the comparison.

5. The method of claim 4, further comprising displaying the result of the comparison in response to receiving the indicator signal.

6. The method of claim 1, wherein the testing of one of the plurality of sub-system modules comprises:

writing data into a register module by an external central processing unit (CPU) host model from a memory in the external CPU host model via a peripheral control interface (PCI);

reading the data in the register module by the external CPU host model;

comparing the data in the register module with the data in the memory of the external CPU host model; and generating an indicator signal indicating whether the register module is functioning properly based on the comparison.

7. The method of claim 6, further comprising displaying the result of the comparison in response to receiving the indicator signal.

8. The method of claim 1, wherein the testing of one of the plurality of sub-system modules comprises:

writing data into a register module by an descriptor management unit (DMU) from a memory in an external central processing unit (CPU) via a peripheral control interface (PCI);

reading the data in the register module by the external CPU host model;

comparing the data in the register module with the data in the memory of the external CPU host model; and generating an indicator signal indicating whether the DMU is functioning properly based on the comparison.

9. The method of claim 8, further comprising displaying the result of the comparison in response to receiving the indicator signal.

10. The method of claim 8, wherein DMU starts to write the data into the register module in response to receiving an INIT Set signal.

11. A method for testing a design for a network interface, comprising:

defining a plurality of sub-system modules for the design of the network interface; and testing at least one of the plurality of sub-system modules using system parameters for the network interface, wherein each of the plurality of sub-system modules comprises at least one component of the network interface, wherein the testing of sub-system module comprises:

writing data into a register module by an descriptor management unit (DMU) from a memory in an external central processing unit (CPU) via a peripheral control interface (PCI);

reading the data in the register module by a media access controller (MAC);

writing the data to a physical layer device (PHY) via a Media Independent Interface management port (MMP);

reading the data in the register module by the external CPU host model;

comparing the data in the register module with the data in the memory of the external CPU host model; and generating an indicator signal indicating whether the MAC and the MMP are functioning properly based on the comparison.

12. The method of claim 11, further comprising displaying the result of the comparison in response to receiving the indicator signal.

13. The method of claim 11, wherein DMU starts to write the data into the register module in response to receiving an INIT Set signal.

* * * * *